(12) United States Patent
Zhou

(10) Patent No.: US 11,978,701 B2
(45) Date of Patent: May 7, 2024

(54) PROGRAMMABLE FUSE WITH SINGLE FUSE PAD AND CONTROL METHODS THEREOF

(71) Applicant: SKYWORKS SOLUTIONS, INC., Irvine, CA (US)

(72) Inventor: Bo Zhou, Acton, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 150 days.

(21) Appl. No.: 15/667,955

(22) Filed: Aug. 3, 2017

(65) Prior Publication Data

US 2018/0047670 A1 Feb. 15, 2018

Related U.S. Application Data

(60) Provisional application No. 62/372,464, filed on Aug. 9, 2016.

(51) Int. Cl.
| | |
|---|---|
| *H01L 21/28* | (2006.01) |
| *G11C 17/16* | (2006.01) |
| *G11C 17/18* | (2006.01) |
| *H01L 23/29* | (2006.01) |
| *H01L 23/495* | (2006.01) |
| *H01L 23/525* | (2006.01) |
| *H01L 23/62* | (2006.01) |

(52) U.S. Cl.
CPC .......... *H01L 23/5256* (2013.01); *G11C 17/16* (2013.01); *G11C 17/18* (2013.01); *H01L 21/28* (2013.01); *H01L 23/291* (2013.01); *H01L 23/49541* (2013.01); *H01L 23/49575* (2013.01); *H01L 23/62* (2013.01); *H01L 2924/0002* (2013.01)

(58) Field of Classification Search
CPC ............................ H01L 23/5256; H01L 21/28
USPC ....................................................... 365/225.7
See application file for complete search history.

(56) References Cited

U.S. PATENT DOCUMENTS

| | | | | |
|---|---|---|---|---|
| 6,163,492 | A * | 12/2000 | Sredanovic ............ | G11C 17/18 365/185.14 |
| 6,307,791 | B1 * | 10/2001 | Otsuka .................. | G11C 7/1051 326/30 |
| 7,304,527 | B1 | 12/2007 | Guzman et al. | |
| 8,441,266 | B1 * | 5/2013 | Xiao ...................... | G01R 31/74 324/550 |
| 8,817,517 | B2 * | 8/2014 | Daigle ................... | G11C 17/18 365/100 |
| 2003/0080717 | A1 * | 5/2003 | Kajimoto ....... | H03K 19/018521 323/273 |

(Continued)

*Primary Examiner* — Muna A Techane
(74) *Attorney, Agent, or Firm* — Lando & Anastasi, LLP

(57) ABSTRACT

A fuse circuit that permits a fuse to be selected and programmed using a single fuse pad. The fuse circuit includes a fuse pad to receive a first voltage, a fuse coupled in series with a voltage controlled switch between the fuse pad and a reference node, and a switch control circuit coupled in series between the fuse pad and the reference node and in parallel with the fuse and the voltage controlled switch, the switch control circuit being configured to select and program the fuse responsive to the first voltage received at the fuse pad. The fuse pad may subsequently be grounded and a sense circuit may be coupled to the fuse to measure a voltage dropped across the fuse to determine whether the fuse has been programmed.

22 Claims, 8 Drawing Sheets

(56) References Cited

U.S. PATENT DOCUMENTS

| | | | |
|---|---|---|---|
| 2005/0212527 A1* | 9/2005 | Wu | G11C 17/16 |
| | | | 324/550 |
| 2005/0237841 A1* | 10/2005 | Wu | G11C 17/18 |
| | | | 365/225.7 |
| 2005/0249014 A1* | 11/2005 | Chung | G11C 17/18 |
| | | | 365/225.7 |
| 2005/0270085 A1* | 12/2005 | Illegems | G11C 17/18 |
| | | | 327/525 |
| 2006/0028777 A1* | 2/2006 | Chung | G11C 17/18 |
| | | | 361/56 |
| 2006/0231922 A1* | 10/2006 | Marr | G11C 17/16 |
| | | | 257/530 |
| 2008/0136496 A1* | 6/2008 | He | H01H 69/01 |
| | | | 327/525 |
| 2008/0150613 A1* | 6/2008 | Agata | H01L 24/05 |
| | | | 327/525 |
| 2009/0002119 A1* | 1/2009 | Nirschl | G11C 17/18 |
| | | | 337/206 |
| 2010/0302699 A1* | 12/2010 | Minami | G11C 17/18 |
| | | | 361/104 |
| 2012/0020139 A1* | 1/2012 | Samuels | G11C 29/50 |
| | | | 365/96 |
| 2012/0038410 A1* | 2/2012 | Liao | G11C 29/028 |
| | | | 327/434 |
| 2013/0201772 A1* | 8/2013 | Rountree | G11C 17/16 |
| | | | 365/189.011 |
| 2017/0346242 A1* | 11/2017 | Howlett | G06F 1/3231 |

* cited by examiner

PROGRAMMABLE FUSE WITH SINGLE FUSE PAD AND CONTROL METHODS THEREOF

CROSS-REFERENCE TO RELATED APPLICATIONS

This application claims the benefit under 35 U.S.C. § 119(e) of U.S. Provisional Application Nos. 62/372,464, titled "PROGRAMMABLE FUSE WITH SINGLE FUSE PAD AND CONTROL METHODS THEREOF," filed on Aug. 9, 2016 which is herein incorporated by reference in its entirety for all purposes.

BACKGROUND

Programmable fuses provide a mechanism for storing data in integrated circuits. A selected fuse can be programmed by providing the selected fuse with a relatively high current to "blow" the selected fuse, permanently altering the fuse's resistance by modifying the physical structure of the fuse. To read the state of the fuse, a sense current or sense voltage is provided and a resulting voltage drop across the fuse is measured. The resulting voltage drop across the fuse can be used to form a binary representation of the fuse state (e.g., blown or unblown), as the voltage drop across the fuse is directly proportional to the resistance of the fuse.

SUMMARY

Aspects and examples are directed to selecting, programming, and reading a fuse using a single fuse pad. In particular, a portion of power provided to the single fuse pad can be used to select a fuse to program and another portion of the power provided to the single fuse pad can be used to program, or "blow," the fuse. The use of a single fuse pad to both select and program fuses reduces the size and complexity of programmable fuses compared to existing programmable fuses.

According to an aspect of the present disclosure, a fuse circuit is provided. The fuse circuit includes a fuse pad to receive a first voltage, a fuse coupled in series with a voltage-controlled switch between the fuse pad and a reference node, and a switch control circuit coupled in series between the fuse pad and the reference node and in parallel with the fuse and the voltage-controlled switch. The switch control circuit is configured to select and program the fuse responsive to the first voltage received at the fuse pad.

In one example, the switch control circuit includes a first resistance connected in series with a second resistance between the fuse pad and the reference node, and the voltage-controlled switch is a transistor. In accordance with an aspect of this example, the voltage-controlled switch is a metal oxide semiconductor field effect transistor having a gate, a source, and a drain, and the fuse has a first terminal and a second terminal. In one embodiment, the source of the metal oxide semiconductor field effect transistor is coupled to the reference node, the drain of the metal oxide semiconductor field effect transistor is coupled to the first terminal of the fuse, and the second terminal of the fuse is coupled to the fuse pad. In another embodiment, the source of the metal oxide semiconductor field effect transistor is coupled to the fuse pad, the drain of the metal oxide semiconductor field effect transistor is coupled to the first terminal of the fuse, and the second terminal of the fuse is coupled to the reference node. In accordance with each of the aforementioned embodiments, the gate is coupled to a node between the first resistance and the second resistance. In accordance with a further aspect of each embodiment, the fuse circuit may further include a sense circuit coupled to the first terminal of the fuse and the drain of the metal oxide semiconductor field effect transistor, the sense circuit being configured to provide a known voltage to the first terminal of the fuse and measure a voltage dropped across the fuse.

According to another aspect of the present disclosure, a method of programming a fuse in a fuse circuit is provided. The method includes receiving a voltage at an external terminal of the fuse circuit, selecting the fuse using a first portion of the voltage received at the external terminal, and programming the fuse using a remaining portion of the voltage received at the external terminal. Programming the fuse can include permanently changing a resistance of the fuse without physically destroying the fuse. In accordance with one example, changing the resistance of the fuse includes increasing the resistance of the fuse by a factor of at least 10. In accordance with one aspect, the method may further include connecting the external terminal of the fuse circuit to a known reference potential, and measuring a voltage drop across the fuse to determine whether the fuse has been programmed. In accordance with another aspect, selecting the fuse includes dropping the first portion of the voltage received at the external terminal through a voltage divider to generate a control voltage and providing the control voltage to a voltage-controlled switch that is connected in series with the fuse between the external terminal and ground.

In accordance with another aspect of the present disclosure, a programmable fuse array is provided. The programmable fuse array includes a plurality of fuse pads, and a plurality of fuse circuits corresponding to each of the plurality of fuse pads. Each respective fuse circuit of the plurality of fuse circuits is connected between a respective fuse pad of the plurality of fuse pads and a reference node, each respective fuse circuit including a fuse coupled in series with a voltage-controlled switch between the respective fuse pad and the reference node and a switch control circuit coupled in series between the respective fuse pad and the reference node and in parallel with the fuse and the voltage controlled switch. The switch control circuit is configured to select and program the fuse of the respective fuse circuit based on a voltage received on the respective fuse pad.

In accordance with one example, each switch control circuit includes a first resistance connected in series with a second resistance between the respective fuse pad and the reference node. Each voltage-controlled switch can be a metal oxide semiconductor field effect transistor having a gate, a source, and a drain, and each fuse can have a first terminal and a second terminal. In one embodiment, in each respective fuse circuit, the source of the metal oxide semiconductor field effect transistor is coupled to the reference node, the drain of the metal oxide semiconductor field effect transistor is coupled to the first terminal of the fuse of the respective fuse circuit, and the second terminal of the fuse of the respective fuse circuit is coupled to the respective fuse pad. In another embodiment, in each respective fuse circuit, the source of the metal oxide semiconductor field effect transistor is coupled to the respective fuse pad, the drain of the metal oxide semiconductor field effect transistor is coupled to the first terminal of the fuse of the respective fuse circuit, and the second terminal of the fuse of the respective fuse circuit is coupled to the reference node. In accordance with each of the afore-mentioned embodiments, the gate of the metal oxide semiconductor field effect transistor of each respective fuse circuit is coupled to a node between the first resistance and the second resistance of the respective fuse circuit. According to a further aspect, the programmable fuse array of can further include a sense circuit coupled to each respective fuse circuit of the plurality of fuse circuits, the sense circuit being configured to provide a known voltage to the first terminal of the fuse of the respective fuse circuit and measure a voltage dropped across the fuse.

According to yet another aspect of the present disclosure, a method of programming a fuse in a fuse array is provided, the fuse array including a plurality of fuse circuits and a plurality of fuse pads, each respective fuse circuit of the plurality of fuse circuits including a respective fuse connected in series between a respective fuse pad of the plurality of fuse pads and ground. The method includes receiving a voltage at a respective fuse pad, selecting the respective fuse using a first portion of the voltage received at the respective fuse pad, and programming the respective fuse using a remaining portion of the voltage received at the respective fuse pad. Programming the respective fuse includes permanently changing a resistance of the respective fuse without physically destroying the respective fuse. In one example, permanently changing the resistance of the respective fuse includes increasing the resistance of the respective fuse by a factor of at least 10. In accordance with a further aspect, the method may further include connecting the respective fuse pad of the respective fuse circuit to ground, and measuring a voltage drop across the respective fuse to determine whether the respective fuse has been programmed. In accordance with a further aspect, selecting the respective fuse includes dropping the first portion of the voltage received at the respective fuse pad through a voltage divider to generate a control voltage and providing the control voltage to a voltage-controlled switch that is connected in series with the respective fuse between the respective fuse pad and ground.

Still other aspects, examples, and advantages of these exemplary aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects of the present disclosure are directed to fuse circuits. These fuse circuits may provide, for example, reduced cost, complexity, size, etc. in selecting and programming fuses compared to existing approaches. These benefits may be achieved using a single fuse pad to both select a fuse to program and to perform the operation of programming, or "blowing," the fuse. The dual nature of the single fuse pad obviates the need for multiple fuse pads, each designed to perform a respective operation separately.

It is to be appreciated that examples of the methods and apparatus discussed herein are not limited in application to the details of construction and the arrangement of components set forth in the following description or illustrated in the accompanying drawings. The methods and apparatus are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
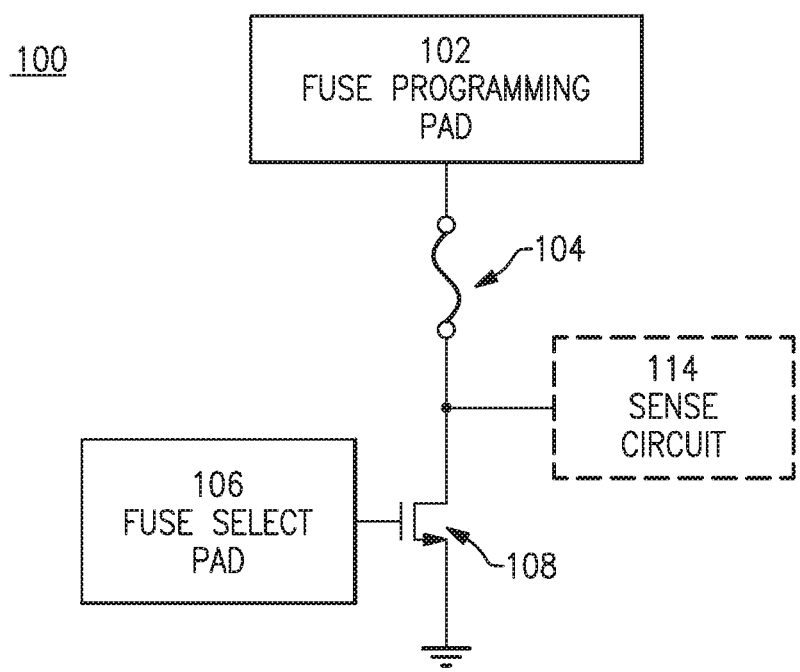
FIG. 1 is a circuit diagram of a conventional fuse circuit.

FIG. 1 illustrates a fuse circuit 100 according to a conventional approach to selecting and programming fuses. The fuse circuit 100 includes a fuse programming pad 102, a fuse 104, a fuse select pad 106, a voltage-controlled switch 108, such as a transistor, and a sense circuit 114.

In operation of the fuse circuit 100, a fuse selection signal having an appropriate voltage level is provided to the fuse select pad 106 and a fuse programming voltage having an appropriate voltage level is provided to the fuse programming pad 102. The voltage level of the fuse selection signal and the programming voltage is sufficient to bias the voltage-controlled switch 108 to an on state, such that a programming current flows from the fuse programming pad 102, through the fuse 104, and through the voltage-controlled switch to the reference node. The programming current is sufficient to alter the physical structure of the fuse 104, referred to as "blowing" the fuse 104, as described in more detail below. The sense circuit 114 may be used to identify whether the fuse 104 has been blown (i.e., programmed) or not.

The fuse circuit 100 suffers from various inefficiencies imposed by the use of multiple fuse pads to perform the operations of selecting a fuse (e.g., via the fuse select pad 106) and programming a fuse (e.g., via the fuse programming pad 102). Further, where it is desired to include the fuse in an integrated circuit in which the number of input and/or output pins may be limited, providing two additional pins to accommodate the selection and programming of the fuse may not be possible. A more efficient fuse circuit, such as fuse circuit 200, combines the selection and programming operations into a single fuse pad.

Figure 2:
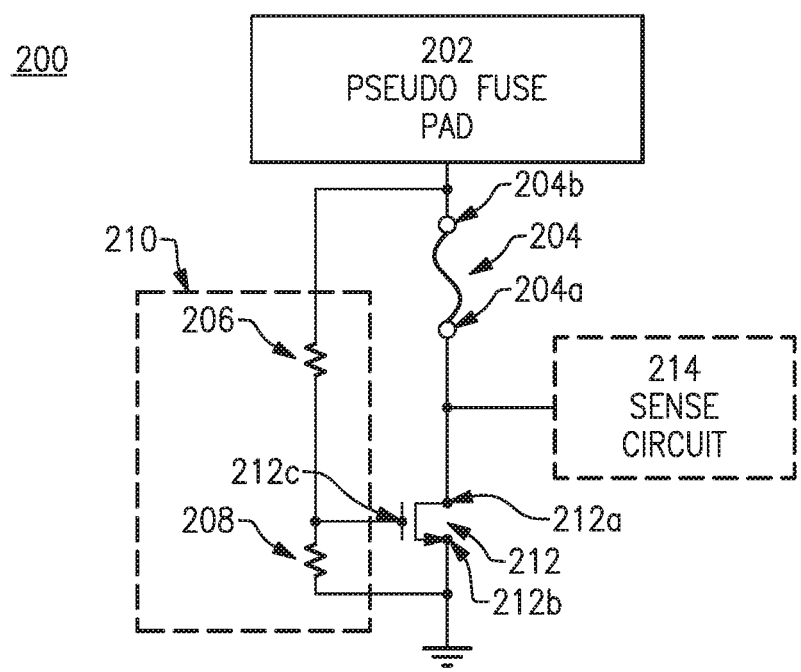
FIG. 2 is a circuit diagram of an example of a fuse circuit.

FIG. 2 illustrates an example of a fuse circuit 200 constructed to select and program a fuse, and read a state (e.g., blown or unblown) of the fuse. It is to be appreciated that alternate implementations of the fuse circuit 200 are possible, as discussed below with respect to FIG. 3.

As illustrated in FIG. 2, the fuse circuit 200 includes a fuse pad 202 that receives an input voltage signal that is used to both select and program a fuse 204. The fuse 204 is programmed, or "blown," when a voltage received on the fuse pad 202 results in a sufficiently large current (e.g., sufficient to modify the physical structure, and thus the resistance, of the fuse 204) through the fuse 204. The fuse 204 may be, for example, a polysilicon fuse that is formed on an integrated circuit substrate that can include a variety of other circuits, such as amplifiers, switches, processors, etc. A voltage-controlled switch 212, such as a transistor, is connected in series with the fuse 204 between the fuse pad 202 and a reference node (e.g., a ground node). Because the switch 212 is connected in series between the fuse 204 and the reference node, a closed (e.g., conducting) state of the switch 212 allows current to flow from the fuse pad 202 through the fuse 204 and the switch 212 to the reference node, thereby blowing the fuse 204. Although the amount of current needed to alter the resistance of a fuse can vary based on the semiconductor processes used to form the fuse, a current of approximately 30-50 mA for about 1-30 msec is typically sufficient to alter the resistance of a polysilicon fuse.

In one example, the voltage-controlled switch 212 is an N-type Metal Oxide Field Effect Transistor (MOSFET) that is configured to close (e.g., conduct) when appropriate voltage levels are applied to a gate and a drain of the N-type MOSFET, and the source is grounded. In the embodiment depicted in FIG. 2, a drain 212$a$ of the switch 212 is coupled to a first terminal 204$a$ of the fuse 204, and a source 212$b$ of the switch 212 is coupled to the reference node. To provide the appropriate voltage levels, the fuse circuit 200 further includes a switch control circuit 210 in the form of a voltage divider. For example, the switch control circuit 210 can include a first resistance 206 and a second resistance 208, coupled in series between the fuse pad 202 and the reference node and in parallel with the fuse 204 and series-connected switch 212, and configured to provide a bias voltage to a gate 212$c$ of the switch 212 based on a voltage received on the fuse pad 202. Responsive to the closing of the switch 212, the fuse 204 sinks a large current received on the fuse pad 202, thereby blowing the fuse 204.

Accordingly, the fuse pad 202 is operable to perform at least two functions. A first portion of the power received by the fuse pad 202 is used by the switch control circuit 210 to bias the switch 212, thereby closing the switch 212 and coupling the fuse 204 to the reference node in a fuse selection process. A second portion of the power received by the fuse pad 202 is used to blow the fuse 204, permanently altering a resistance value of the fuse 204. For example, in one embodiment, an unblown fuse has a resistance of roughly 100 to 200 Ohms (Ω), while a blown fuse has a resistance of roughly 2,000Ω or more (i.e., roughly a tenfold increase or more).

In accordance with aspects of the present disclosure, the act of blowing the fuse 204 does not physically destroy the fuse 204, as physical destruction of the fuse 204 could impact other devices proximate to the fuse 204. Rather, in a blown state, the fuse 204 remains physically intact, but the structure of the fuse 204 is changed sufficiently to alter a resistance value of the fuse 204 by, in the example illustrated above, a tenfold increase or more.

As discussed above, the fuse 204 can be blown to permanently alter the fuse's resistance. Furthermore, a sense circuit 214 can be used to provide a known current or voltage to the fuse 204, and to sense a resulting voltage drop across the fuse 204. Because the resulting voltage drop across the fuse 204 is proportional to the fuse's resistance, and the fuse's resistance is determined largely by the state of the fuse 204 (e.g., whether the fuse 204 is blown or unblown), the sensed voltage drop reflects the state of the fuse 204. For example, the fuse circuit 200 can include a sense circuit 214 coupled to the first terminal 204$a$ of the fuse 204 and the drain 212$a$ of the switch 212 and configured to sense the state of the fuse 204.

After the fuse programming process described above is complete, the fuse pad 202 is grounded. Once the fuse pad is grounded, the fuse circuit 200 consumes little to no power, except when the sense circuit is active. With the fuse pad 202 grounded, the switch 212 is turned off and is in an open (non-conducting) state. The sense circuit 214 provides a known sense current (or alternatively, a known sense voltage) to the fuse 204, and senses a resulting voltage drop across the fuse 204. Accordingly, the sense circuit 214 is operable to detect whether the fuse 204 has been blown based on the detected voltage drop across the fuse 204.

For example, in one embodiment, the sense circuit 214 provides a voltage of approximately 1.8 volts to the first terminal 204$a$ of the fuse 204, and senses a resulting voltage drop across the fuse 204. The voltage level used by the sense circuit 214 to sense the state of the fuse may vary anywhere from about 1 volt to about 3 volts, depending on the level of voltages available in the integrated circuit in which the fuse 204 is integrated. The voltage drop across a blown fuse can, in one example, be roughly 30 mV greater than a voltage drop across an unblown fuse. The sense circuit 214 can therefore interpret the increase of 30 mV in voltage drop as an indication of the fuse 204 having been blown. It is to be appreciated that the fuse circuit 200 disclosed herein provides a mechanism for selecting and programming a fuse using a single fuse pad. A state (i.e., 'blown' or 'unblown') of the fuse can be read by a sense circuit, thereby providing a binary memory element.

Figure 3:
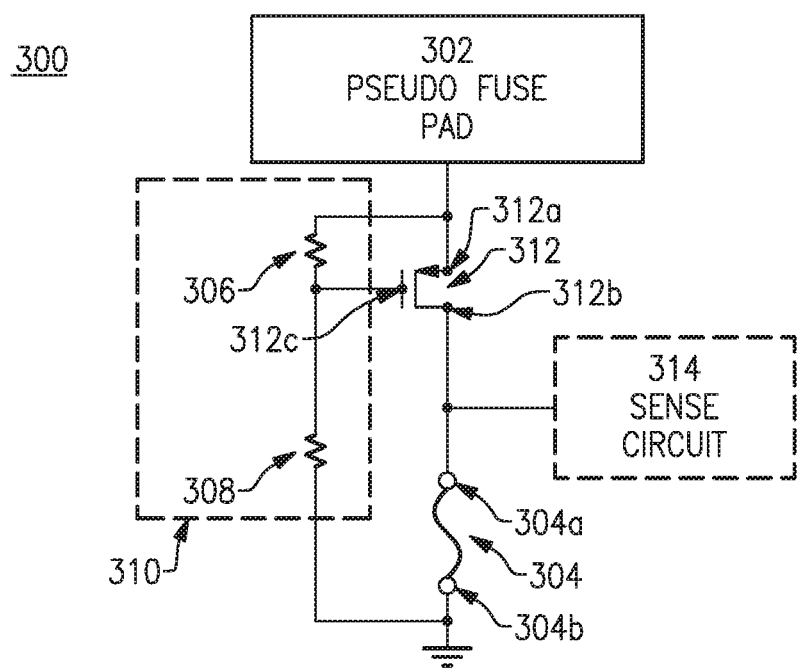
FIG. 3 is a circuit diagram of another example of a fuse circuit.

FIG. 3 illustrates an alternate fuse circuit 300 that also provides the aforementioned benefits of a single fuse pad solution to selecting and programming a fuse. As discussed above, the fuse circuit 200 of FIG. 2 includes a voltage-controlled switch 212 (e.g., an N-type MOSFET) that is coupled between the sense circuit 214 and a reference node. In alternate embodiments, such as in the fuse circuit 300 of FIG. 3, an alternate type of voltage-controlled switch 312 (e.g., a P-type MOSFET) is used instead.

In the embodiment depicted in FIG. 3, a source 312a of the switch 312 is coupled to the fuse pad 302, a drain 312b of the switch 312 is coupled to a first terminal 304a of the fuse 304, and a second terminal 304b of the fuse 304 is coupled to the reference node (e.g., a ground node). The state of the switch 312 is controlled by a bias voltage provided to a gate 312c of the switch 312 by a switch control circuit 310 in the form of a voltage divider, which includes a first resistance 306 and a second resistance 308 coupled in series between the fuse pad 302 and the reference node and in parallel with the series-connected switch 312 and fuse 304. During fuse selection and programming, a suitable voltage is provided is provided to the fuse pad 302. The voltage received at the fuse pad 302 biases the switch 312 to an on (e.g., conducting) state and current through the switch 312 and the fuse 304 blows the fuse 304 in a manner similar to that discussed above with respect to FIG. 2. A sense circuit 314 is coupled to the first terminal 304a of the fuse 304 and the drain 312b of the switch 312 and configured to sense the state of the fuse 304. To sense the state of the fuse 304, the fuse pad 302 may be grounded as discussed above with respect to the fuse circuit 200, thereby opening the switch 312. The sense circuit 314 provides a known sense current, or alternatively a known sense voltage, to the fuse 304, causing current to flow through the fuse 304 and to the ground node. The sense circuit 314 can measure the voltage drop across the fuse 304 to sense the state of the fuse 304.

As discussed above, the fuse circuits 200 and 300 may be used to store a binary logic state corresponding to whether the fuse is blown or not. It should be appreciated that multiple fuse circuits such as those illustrated and described with respect to FIGS. 2 and 3 may be provided in parallel with one another and used to form a multi-bit memory element.

Figure 4:
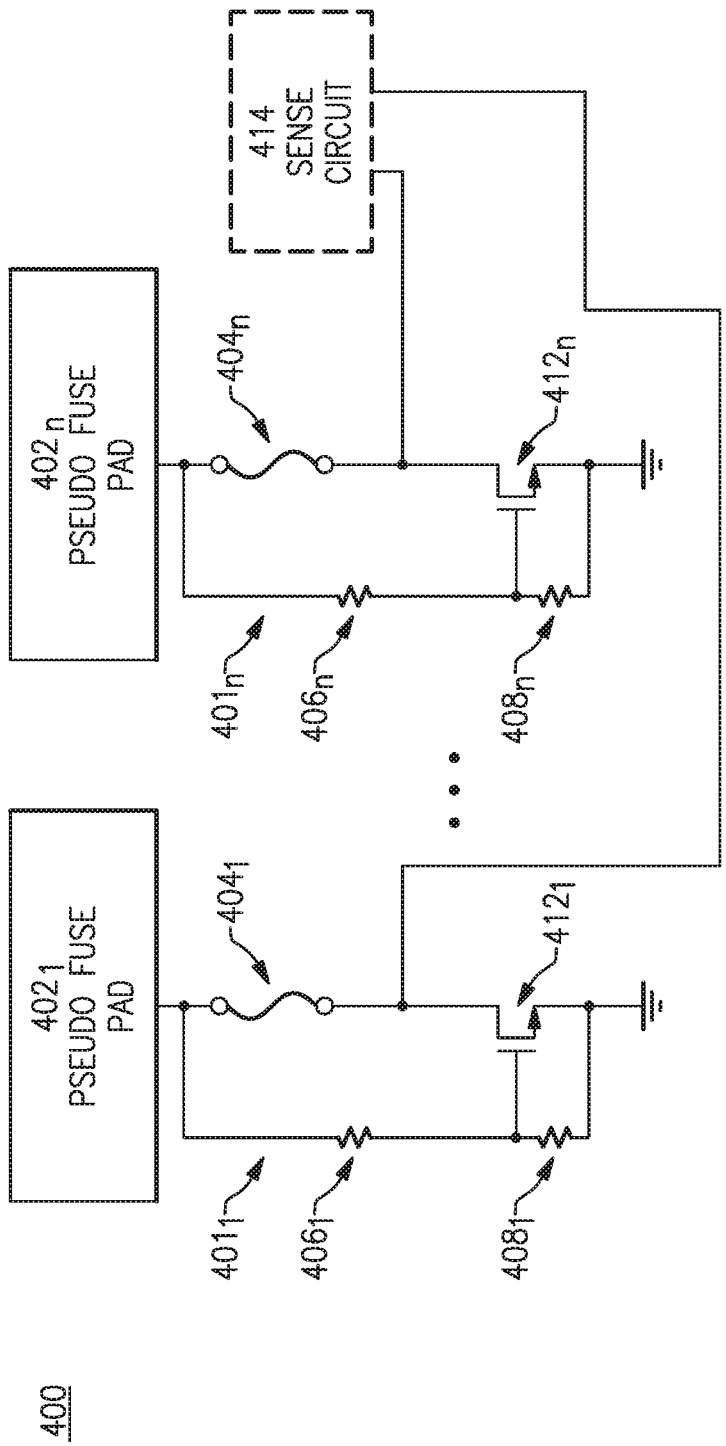
FIG. 4 is a circuit diagram of a multi-bit fuse circuit including a plurality of fuse circuits similar to the fuse circuit of FIG. 2.

For example, FIG. 4 illustrates a multi-bit fuse circuit 400 including a plurality of fuse circuits $401_1$ through $401_n$ similar to the fuse circuit 200 of FIG. 2 connected in parallel with one another and coupled to a single sense circuit 414. Each fuse circuit $401_i$ of the plurality of fuse circuits $401_1$ through $401_n$ includes a fuse pad $402_n$ a first resistance $406_i$, and a second resistance $408_i$ coupled in series between the fuse pad $402_i$ and a reference node (e.g., a ground node), and a fuse $404_i$ and a voltage-controlled switch $412_i$ (e.g., an N-type MOSFET) coupled together in series between the fuse pad $402_i$ and the reference node and in parallel with the first resistance $406_i$ and the second resistance $408_i$. The sense circuit 414 is respectively coupled to the series interconnection of the drain of the switch $412_i$ and the first terminal of the fuse $404_i$ of a respective fuse circuit $401_i$. Subsequent to the fuse selection and programming process discussed above, each of the respective fuse pads $404_i$ may be grounded and the sense circuit 414 may be used to sense the state of each fuse $404_i$ of the plurality of fuse circuits. It should be appreciated that other embodiments may alternatively use P-type MOSFET switches similar to that shown in FIG. 3. In alternate embodiments, in lieu of a single sense circuit $414_i$ each fuse circuit of the multi-bit fuse circuit 400 can include a respective dedicated sense circuit (not shown) configured to sense the state of each associated fuse circuit. Although the switching elements disclosed herein have substantially been depicted as MOSFETs, it is to be understood that other switching elements can be used including, for example, relays, Junction Field Effect Transistors (JFETs), Bipolar Junction Transistors (BJTs), and so forth.

Data stored by the multi-bit fuse circuit 400 can be used for a variety of implementations and applications. For example, the data can be used to store device manufacturing data, such as a wafer lot number to track a device in which the multi-bit memory element 400 is implemented, to provide a unique device identifier where a plurality of the same devices are integrated within a module and used for different purposes (e.g., to set a serial bus device identifier), to identify device parameters (e.g., resistance values, capacitance values, inductance values, gain values etc.) after device fabrication, or any other purposes for which programmable fuse elements are traditionally used.

Figure 5:
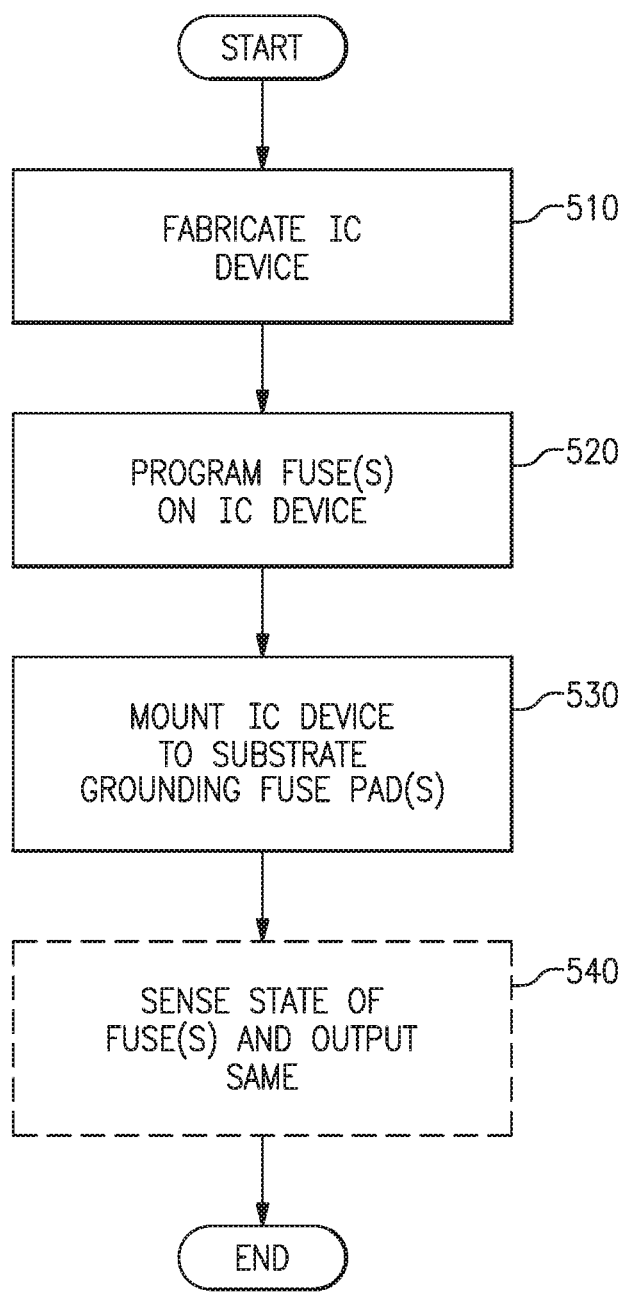
FIG. 5 is a flowchart illustrating a method of manufacturing a packaged module that includes one or more integrated circuit die, in which the integrated circuit die includes a fuse circuit.

FIG. 5 is a flowchart illustrating a method of manufacturing a packaged module 700 (see FIG. 7) that includes one or more integrated circuit die and a substrate, in which one or more of the integrated circuit die may include a fuse circuit according to aspects of the present disclosure. The fuse circuit may be used to store binary data relating to the integrated circuit die, or devices integrated therein, such as a power amplifier, an RF coupler, an antenna switching module, an attenuator, a filter module, or combinations thereof. This binary data may include manufacturing data, such as a wafer lot number, a device identifier, device parameters or settings, such as gain levels, bias current levels, attenuation settings, filter pass or cutoff frequencies, etc.

In act 510 an integrated circuit device is formed in an integrated circuit die 600 (see FIG. 6A) that is fabricated according to design rules applicable to the technology (e.g., SOI, GaAs, CMOS, biCMOS, SiGe, etc.) being used to form the integrated circuit device. During the fabrication of the integrated circuit device, one or more fuse circuits 200, 300, 400 may be implemented in the integrated circuit die.

In act 520 one or more of the fuses $404_{1-n}$ are programmed, e.g., blown. For example, the fuses may be programmed as discussed above by providing an appropriate voltage level on a respective fuse pad 202, 302, $402_{1-n}$ of a respective fuse. This programming may, for example, be performed during verification testing of the integrated circuit die, using for example a bed of nails tester, or at a later stage of manufacture, after verification testing.

In act 530, the integrated circuit die 600 is mounted (e.g., aligned and bonded) to a substrate 650 (see FIG. 6B), such that each respective fuse pad 202, 302, $402_{1-n}$ is electrically connected to a ground pad $605_{1-n}$ on the substrate. The substrate 650 may be, for example a circuit board formed of a glass epoxy laminate, a ceramic substrate, etc. It should be appreciated that other integrated circuit die, as well as discrete components such as resistors, capacitors, inductors, etc., may be mounted to the substrate 650 in act 530. Following the mounting of the integrated circuit die 600 to the substrate 650, the substrate and any other integrated circuit die or discrete components mounted thereto may be encapsulated in plastic or another type of molding compound, such as SU-8, to form a packaged module 700 (see FIG. 7). Once the integrated circuit die 600 is mounted to the substrate 650, the state of the one or more fuses may be sensed by the sensing circuit and output to an interface device, such as a control and interface circuit, in act 540 to communicate the binary information corresponding to the state of the fuses to the control and interface circuit or another device. It should be appreciated that because sensing the state of the fuse is generally performed after the packaged module has been manufactured, act 540 is depicted in dashed line form to illustrate that it need not be a part of the process of manufacture of the packaged module 700.

Figure 6A:
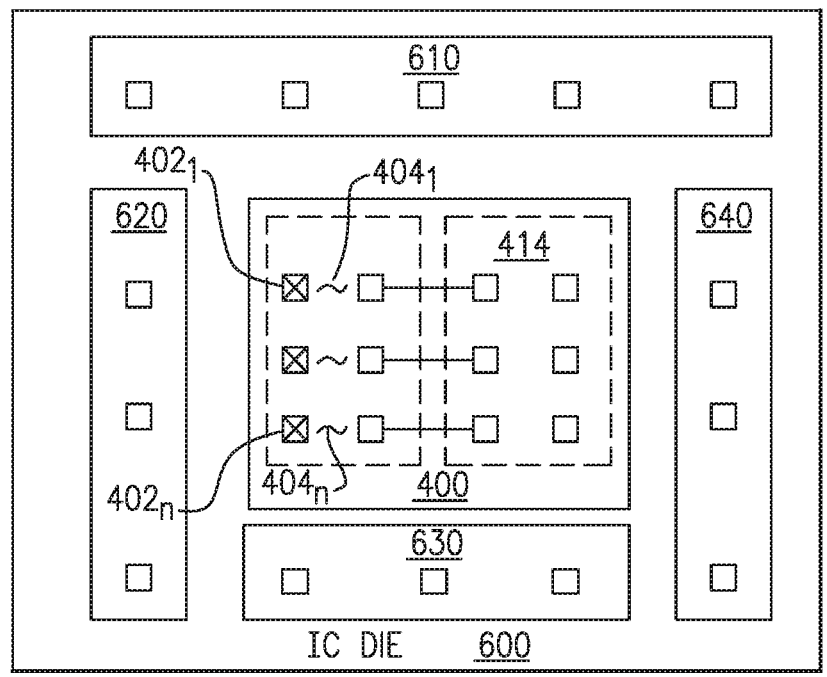
FIG. 6A illustrates an integrated circuit die that includes a fuse circuit in accordance with the present disclosure.
Figure 6B:
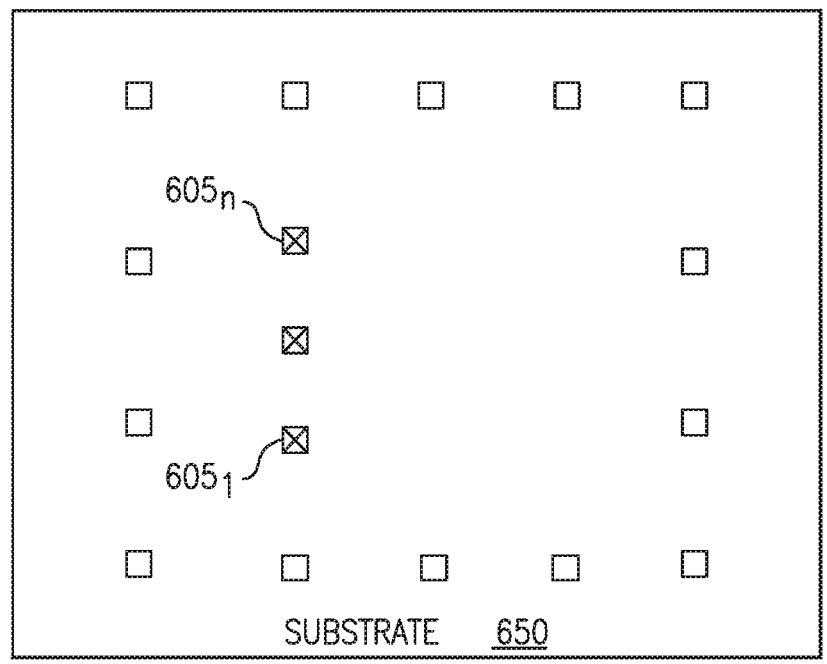
FIG. 6B illustrates a substrate to which the integrated circuit die of FIG. 6A may be mounted to form a packaged module.

FIGS. 6A and 6B illustrate the manner in which the integrated circuit die 600 including a fuse circuit, such as the multi-bit fuse circuit 400 of FIG. 4, may be incorporated into a packaged module 700 that includes the integrated circuit die 600 and the substrate 650, with FIG. 6A illustrating the integrated circuit die 600 and FIG. 6B illustrating the substrate 650 to which the integrated circuit die is mounted.

As shown in FIG. 6A the integrated circuit die 600 includes the multi-bit fuse circuit 400, such as the multi-bit fuse circuit illustrated in FIG. 4, as well as other integrated circuitry 610, 620, 630, and 640. For example, the other integrated circuitry on the integrated circuit die 600 may include a control and interface circuit 610, an attenuator 620, a power amplifier 630, and an impedance matching circuit 640, such as those illustrated in FIG. 7. The multi-bit fuse circuit 400 can include one or more fuses $404_1$ to $404_n$, each having a respective fuse pad $402_1$ to $402_n$ and a fuse sense circuit 414. The integrated circuit die 600 can be mounted to the substrate 650, potentially with other components or integrated circuit die (not shown), and encapsulated in a molding compound to form, for example, a power amplifier module that includes the control and interface circuit 610, the attenuator 620, the power amplifier 630, the impedance matching circuit 640, and the multi-bit fuse circuit 400. As described previously with respect to FIG. 5, after fabrication of the integrated circuit die 600, one or more of the fuses $404_1$ to $404_n$ may be programmed (act 520, FIG. 5) by providing an appropriate voltage level on a respective fuse pad $402_1$ to $402_n$. For example, where the multi-bit fuse circuit 400 is associated with a power amplifier module 700, the multi-bit fuse circuit 400 may store binary data that identifies the wafer lot number or other manufacturing data, as well as specific device parameters, such as the gain of the power amplifier 630, attenuation values of the attenuator 620, impedance values of the impedance matching circuit 640, bias current or voltage settings for the power amplifier 630, frequency bands of operation for which the power amplifier module 700 is configured, etc.

After programming one or more of the respective fuses $404_1$ to $404_n$, the integrated circuit die 600 may be aligned with the substrate 650 and mounted, for example, by flip chip mounting, to the substrate such that each respective fuse pad $402_1$ to $402_n$ is electrically connected to a respective ground pad $605_1$ to $605_n$ on the substrate 650 (act 530, FIG. 5). The substrate 650 may, for example, include contact pads located on the underside of the substrate (e.g., a surface opposite the surface to which the integrated circuit die is mounted). After alignment and mounting, the integrated circuit die 600 and any other components may be encapsulated by a molding compound to form a packaged module 700 that may be incorporated in an electronic device, such as, for example, a smart phone, a wireless router, etc.

Figure 7:
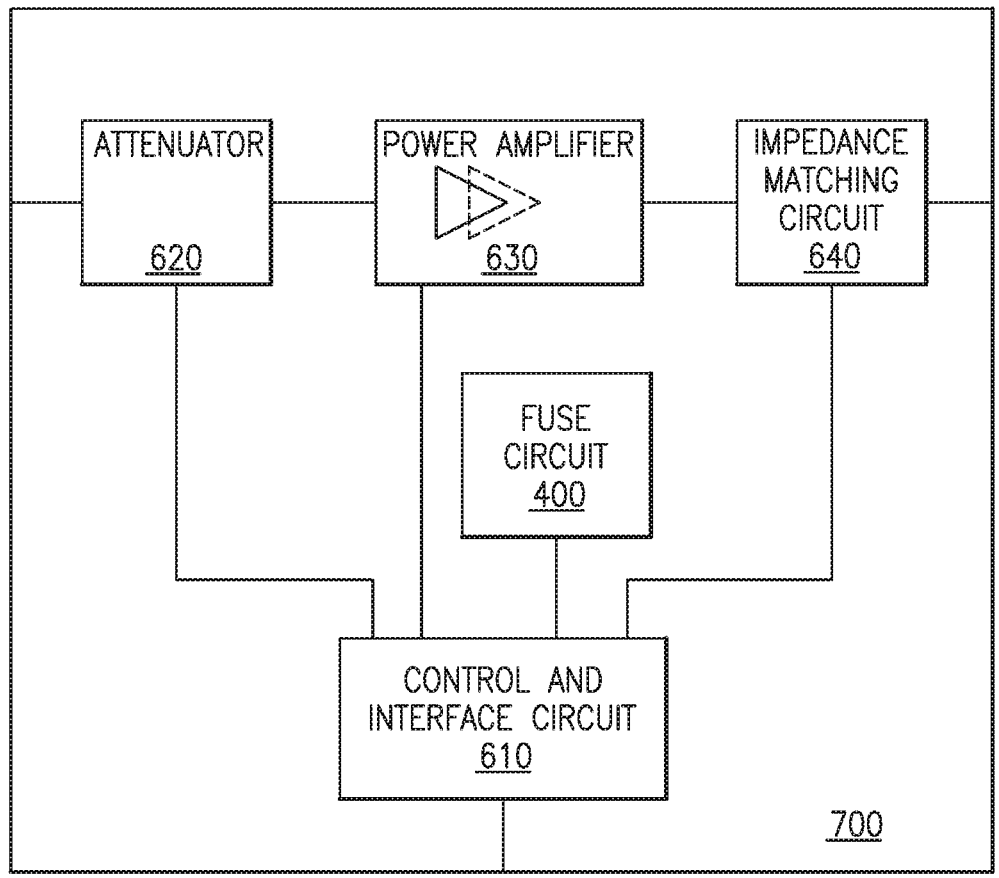
FIG. 7 is a functional block diagram of a packaged power amplifier module that can include a fuse circuit in accordance with the present disclosure.

FIG. 7 illustrates a packaged module, such as power amplifier module 700 that can include a fuse circuit, such as the multi-bit fuse circuit 400. The power amplifier module 700 includes a control and interface circuit 610, an attenuator 620, a power amplifier 630, an impedance matching circuit 640, and a fuse circuit, such as the multi-bit fuse circuit 400 described above. Although previously described as being commonly formed on a single integrated circuit die 600, it should be appreciated that one or more of the control and interface circuit 610, the attenuator 620, the power amplifier 630, or the impedance matching circuit 640 could alternatively be formed on a separate die. The attenuator 620 is configured to receive a Radio Frequency (RF) signal, attenuate the RF signal, and provide the attenuated RF signal to the power amplifier 630. Although not shown, an impedance matching circuit may also be provided and coupled to an input of the attenuator 620 to better match the input impedance of the power amplifier module 700 to the impedance of the upstream circuitry providing the RF signal. The power amplifier 630, which may include one or more amplification stages, receives the attenuated RF signal, amplifies the attenuated RF signal, and provides the amplified RF signal to the impedance matching circuit 640. The amplified RF signal output from the impedance matching circuit 640 may be provided to downstream circuitry, such as a coupler, an antenna switch module (ASM), or an antenna as discussed further below. The control and interface circuit 610 may be used to control one or more of the attenuator 620, the power amplifier 630, and the impedance matching circuit 640, and to communicate information stored in the fuse circuit 400 to other devices.

Embodiments of the fuse circuits 200, 300, 400 described herein, optionally packaged into a packaged module 700 discussed above, may be advantageously used in a variety of electronic devices, such as wireless communications devices (e.g., cell phones, tablets, etc.).

Figure 8:
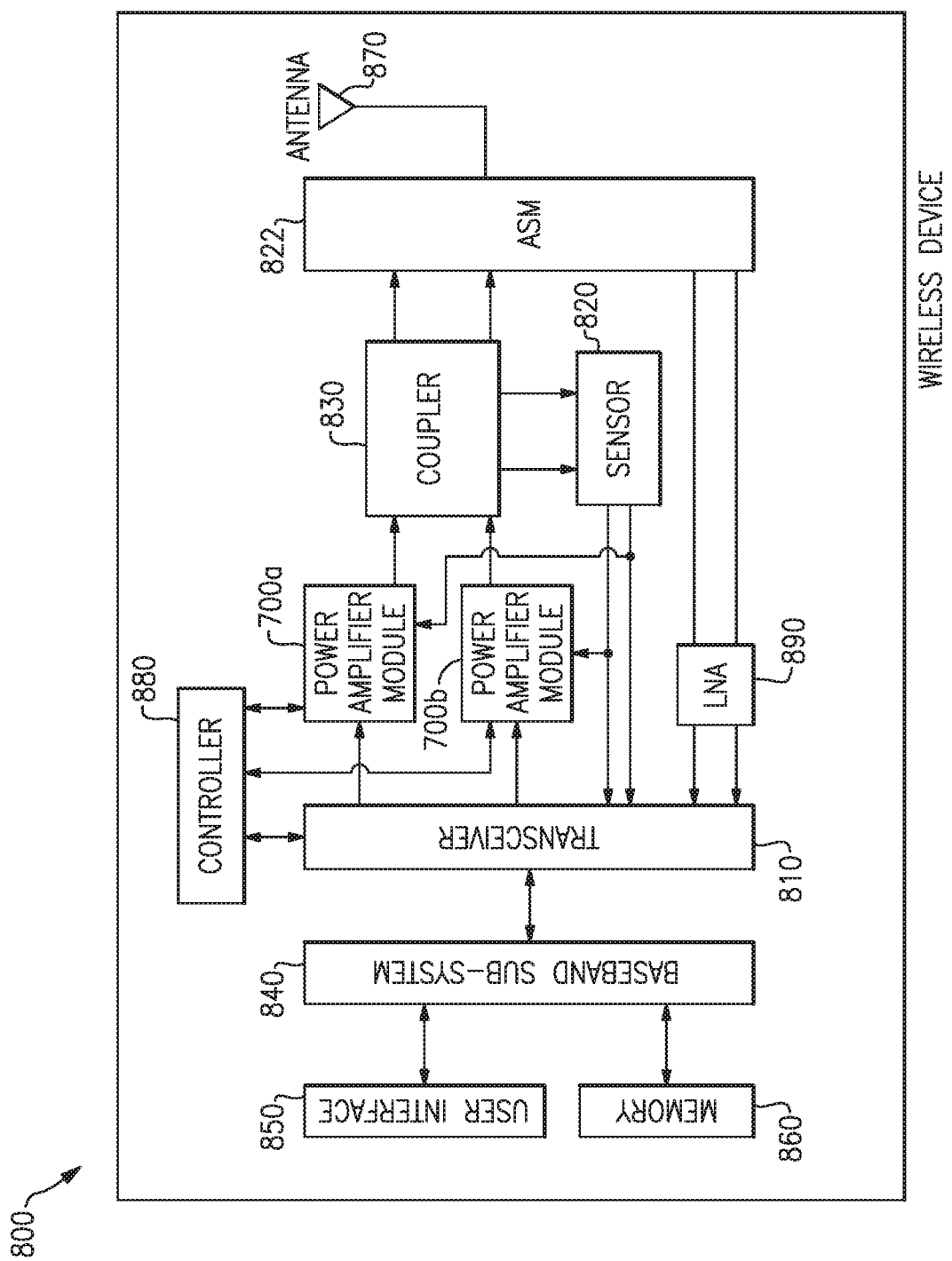
FIG. 8 is a block diagram of one example of a wireless communications device in which embodiments of a packaged module, such as the packaged power amplifier module of FIG. 7, can be used.

FIG. 8 is a block diagram of one example of a wireless communications device 800 in which embodiments of a packaged module 700 can be used. The wireless device 800 can be a mobile phone, such as a smart phone, for example. By way of example, the wireless communications device 800 can communicate in accordance with Long Term Evolution (LTE). In this example, the wireless communications device 800 can be configured to operate at one or more frequency bands defined by an LTE standard. The wireless device 800 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated in FIG. 8, the wireless communications device 800 can include an antenna 870 and a transceiver 810. The transceiver 810 can generate RF signals for transmission via the antenna 870. Furthermore, the transceiver 810 can receive incoming RF signals from the antenna 870. It will be understood that various functionalities associated with transmitting and receiving of RF signals can be achieved by one or more components that are collectively represented in FIG. 8 as the transceiver 810. For example, a single component can be configured to provide both transmitting and receiving functionalities. In another example, transmitting and receiving functionalities can be provided by separate components.

In one embodiment, the wireless device 800 includes a plurality of power amplifier modules 700a, 700b, each of which may include a fuse circuit in accordance with aspects of the present disclosure. For example, the first power amplifier module 700a may be configured for use in a high frequency band, e.g., 5-8 GHz, while the second power amplifier module is configured for use in a lower frequency band, e.g., 1900 MHz or 2700 MHz. The different configuration settings of the power amplifier modules 700a and 700b may be stored in the multi-bit fuse circuit 400 in each of the power amplifier modules. Signals generated for transmission are received by the power amplifier (PA) module 700, which amplifies the generated signals from the transceiver 810. As will be appreciated by those skilled in the art, each power amplifier module 700 can include one or more power amplifiers. The power amplifier module 700 can be used to amplify a wide variety of RF or other frequency-band transmission signals. For example, the power amplifier module 700 can receive an enable signal that can be used to pulse the output of the power amplifier to aid in transmitting a wireless local area network (WLAN) signal or any other suitable pulsed signal. The power amplifier module 700 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 700 and associated components including switches and the like can be fabricated on GaAs substrates using, for example, pHEMT or BiFET transistors, or on a Silicon substrate using CMOS transistors.

In certain embodiments, the wireless device 800 also includes a coupler 830 and sensor 820 for measuring the power levels of transmitted signals from the power amplifier modules 700. The sensor 820 can send information to the transceiver 810 and/or directly to the power amplifier modules 700 as feedback for making adjustments to regulate the power level of the transmitted signals or gain of the power amplifier modules 700, for example. In certain embodiments in which the wireless device 800 is a mobile phone having a time division multiple access (TDMA) architecture, the coupler 830 can advantageously manage the amplification of an RF transmitted power signal from the power amplifier modules 700. In a mobile phone having a time division multiple access (TDMA) architecture, such as those found in Global System for Mobile Communications (GSM), code division multiple access (CDMA), and wideband code division multiple access (W-CDMA) systems, the power amplifier module 700 can be used to shift power envelopes up and down within prescribed limits of power versus time.

The wireless device 800 can further include an antenna switch module 822, for example, which can be configured to switch between different bands and/or modes, transmit and receive modes etc. As shown in FIG. 8, in certain embodiments the antenna 870 both receives signals that are provided to the transceiver 810 via the antenna switch module 822 and also transmits signals that are received from the transceiver 810 via antenna switch module 822. However, in other examples multiple antennas can be used.

In the receive path, the wireless device 800 may include a low noise amplifier (LNA) module 890, which may include one or more low noise amplifiers configured to amplify the received signals. The low noise amplifier module 890 may also include a fuse circuit. In other examples a power amplifier module 700 and a low noise amplifier module 890 can be combined, optionally with some or all of the functionality of the transceiver 810.

Still referring to FIG. 8, the wireless device 800 further includes a controller 880. The controller 880 can include any number of sub-controllers or processors, can control the transmission of signals, and can also configure various components of the wireless device 800. The controller 880 may further include a power management system (not shown) that is connected to the transceiver 810 and that manages the power for the operation of the wireless device. The power management system can also control the operation of a baseband sub-system 840 and other components of the wireless device 800. The power management system can include, or can be connected to, a battery (not shown) that supplies power for the various components of the wireless device 800. In one embodiment, the baseband sub-system 840 is connected to a user interface 850 to facilitate various input and output of voice and/or data provided to and received from the user. The baseband sub-system 840 can also be connected to a non-transient computer readable memory 860 that is configured to store data and/or instructions to facilitate the operation of the wireless device, and/or to provide storage of information for the user.

As will be appreciated by those skilled in the art, the implementation shown in FIG. 8 is exemplary and non-limiting. The wireless device 800 can include elements that are not illustrated in FIG. 8 and/or a sub-combination of the illustrated elements. Further, the components of the wireless device 800 can be arranged in a manner different from that shown in FIG. 8. Some of the embodiments described above have provided examples in connection with mobile devices. However, the principles and advantages of the embodiments can be used for any other systems or apparatus that could benefit from any of the circuits described herein. Any of the principles and advantages discussed herein can be implemented in an electronic system that uses mixed-signal dies. Thus, aspects of this disclosure can be implemented in various electronic devices. Examples of the electronic devices can include, but are not limited to, consumer electronic products, parts of the consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a clock, etc. Further, the electronic devices can include unfinished products.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A fuse circuit, comprising:
   a fuse pad to receive a first voltage;
   a fuse coupled in series with a voltage-controlled switch between the fuse pad and a reference node; and
   a switch control circuit coupled in series between the fuse pad and the reference node and in parallel with the fuse and the voltage-controlled switch, the switch control circuit being configured to both select the fuse to program by controlling the voltage-controlled switch to be in a closed and conducting state to allow current to flow through the fuse and through the voltage-controlled switch, and to allow the fuse to be programmed by the first voltage based solely in response to the first voltage being received at the fuse pad.

2. The fuse circuit of claim 1 wherein the switch control circuit includes a first resistance connected in series with a second resistance between the fuse pad and the reference node.

3. The fuse circuit of claim 2 wherein the voltage-controlled switch is a transistor.

4. The fuse circuit of claim 2 wherein the voltage-controlled switch is a metal oxide semiconductor field effect transistor.

5. The fuse circuit of claim 4 wherein the metal oxide semiconductor field effect transistor has a gate, a source, and a drain, the fuse has a first terminal and a second terminal, and the source of the metal oxide semiconductor field effect transistor is coupled to the reference node, the drain of the metal oxide semiconductor field effect transistor is coupled to the first terminal of the fuse, and the second terminal of the fuse is coupled to the fuse pad.

6. The fuse circuit of claim 5 wherein the gate is coupled to a node between the first resistance and the second resistance.

7. The fuse circuit of claim 6 further comprising a sense circuit coupled to the first terminal of the fuse and the drain of the metal oxide semiconductor field effect transistor, the sense circuit being configured to provide a known voltage to the first terminal of the fuse and measure a voltage dropped across the fuse.

8. The fuse circuit of claim 4 wherein the metal oxide semiconductor field effect transistor has a gate, a source, and a drain, the fuse has a first terminal and a second terminal, and the source of the metal oxide semiconductor field effect transistor is coupled to the fuse pad, the drain of the metal oxide semiconductor field effect transistor is coupled to the first terminal of the fuse, and the second terminal of the fuse is coupled to the reference node.

9. A method of programming a fuse in a fuse circuit including a voltage-controlled switch coupled to the fuse, the method comprising:
receiving a voltage at an external terminal of the fuse circuit; and
selecting the fuse to program using a first portion of the received voltage that is received at the external terminal by closing the voltage-controlled switch to allow a current to flow through the fuse and through the voltage-controlled switch, and programming the fuse using a remaining portion of the received voltage that is received at the external terminal, both the selecting and programming being performed solely in response to receiving the voltage at the external terminal of the fuse circuit.

10. The method of claim 9 wherein programming the fuse includes permanently changing a resistance of the fuse without physically destroying the fuse.

11. The method of claim 9 wherein programming the fuse includes permanently changing a resistance of the fuse.

12. The method of claim 11 wherein permanently changing the resistance of the fuse includes increasing the resistance of the fuse by a factor of at least 10.

13. The method of claim 11 further comprising:
connecting the external terminal of the fuse circuit to a known reference potential; and
measuring a voltage drop across the fuse to determine whether the fuse has been programmed.

14. The method of claim 9 wherein programming the fuse includes electrically coupling the fuse in series between the external terminal and ground.

15. The method of claim 9 wherein selecting the fuse includes dropping the first portion of the voltage received at the external terminal through a voltage divider to generate a control voltage and providing the control voltage to the voltage-controlled switch which is connected in series with the fuse between the external terminal and ground.

16. A programmable fuse array, comprising:
a plurality of fuse pads; and
a plurality of fuse circuits, each fuse circuit of the plurality of fuse circuits corresponding to a respective fuse pad of the plurality of fuse pads, each respective fuse circuit of the plurality of fuse circuits being connected between the respective fuse pad of the plurality of fuse pads and a reference node, each respective fuse circuit including a fuse coupled in series with a voltage-controlled switch between the respective fuse pad and the reference node and a switch control circuit coupled in series between the respective fuse pad and the reference node and in parallel with the fuse and the voltage-controlled switch, the switch control circuit being configured to both select the fuse to program based on a voltage received at the respective fuse pad by controlling the voltage-controlled switch to be in a closed and conducting state to allow current to flow through the fuse and through the voltage-controlled switch, and to allow the fuse of the respective fuse circuit to be programmed by the voltage based solely in response to the voltage being received at the respective fuse pad.

17. The programmable fuse array of claim 16 wherein each switch control circuit includes a first resistance connected in series with a second resistance between the respective fuse pad and the reference node.

18. The programmable fuse array of claim 17 wherein each voltage-controlled switch is a metal oxide semiconductor field effect transistor.

19. The programmable fuse array of claim 18 wherein each metal oxide semiconductor field effect transistor has a gate, a source, and a drain, each fuse has a first terminal and a second terminal, and in each respective fuse circuit, the source of the metal oxide semiconductor field effect transistor is coupled to the reference node, the drain of the metal oxide semiconductor field effect transistor is coupled to the first terminal of the fuse of the respective fuse circuit, and the second terminal of the fuse of the respective fuse circuit is coupled to the respective fuse pad.

20. The programmable fuse array of claim 19 wherein the gate of the metal oxide semiconductor field effect transistor of each respective fuse circuit is coupled to a node between the first resistance and the second resistance of the respective fuse circuit.

21. The programmable fuse array of claim 20 further comprising a sense circuit coupled to each respective fuse circuit of the plurality of fuse circuits, the sense circuit being configured to provide a known voltage to the first terminal of the fuse of the respective fuse circuit and measure a voltage dropped across the fuse.

22. The programmable fuse array of claim 18 wherein each metal oxide semiconductor field effect transistor has a gate, a source, and a drain, each fuse has a first terminal and a second terminal, and in each respective fuse circuit, the source of the metal oxide semiconductor field effect transistor is coupled to the respective fuse pad, the drain of the metal oxide semiconductor field effect transistor is coupled to the first terminal of the fuse of the respective fuse circuit, and the second terminal of the fuse of the respective fuse circuit is coupled to the reference node.

* * * * *